United States Patent [19]

Kawashima et al.

[11] Patent Number: 4,865,123

[45] Date of Patent: Sep. 12, 1989

[54] APPARATUS FOR SUPPLYING COOLING FLUID

[75] Inventors: Hisashi Kawashima; Tsuguo Okada; Haruhiko Yamamoto, all of Yokohama, Japan

[73] Assignee: Fujitsu Limited, Kawasaki, Japan

[21] Appl. No.: 259,314

[22] Filed: Oct. 18, 1988

[30] Foreign Application Priority Data

Oct. 22, 1987 [JP] Japan .................. 62-26124

[51] Int. Cl.[4] .............. H01L 23/46; F28D 15/00
[52] U.S. Cl. .................. 165/104.33; 165/104.19; 165/104.31; 165/119; 165/101; 361/385
[58] Field of Search ............... 165/104.33, 101, 100, 165/119, 104.31, 104.19; 361/385

[56] References Cited

U.S. PATENT DOCUMENTS

4,120,021 10/1978 Roush .................. 361/385
4,513,346 4/1985 Devins .................. 361/385
4,721,996 1/1988 Tustaniwsbyj et al. ........ 361/385

Primary Examiner—Albert W. Davis, Jr.
Attorney, Agent, or Firm—Staas & Halsey

[57] ABSTRACT

An apparatus for circulating cooling fluid through a plurality of cooling modules for cooling electronic components, such as IC'S or LSI'S. A plurality of cooling fluid supply systems are independently connected to the respective cooling modules. Each of the supply systems includes a fluid line connected to a single tank containing cooling fluid and is provided with a pump and a heat exchanger, so that the cooling fluid in the tank is circulated through the respective cooling modules and returned to the tank, in which the cooling fluid is then mixed.

20 Claims, 5 Drawing Sheets

APPARATUS FOR SUPPLYING COOLING FLUID

BACKGROUND OF THE INVENTION

1. Field of the Invention

This invention relates to a cooling system, and more particularly, to an apparatus for compulsorily supplying a cooling fluid or coolant, such as water, fluorocarbon liquid, or the like, for circulation through a plurality of cooling modules for cooling electronic components, such as integrated circuits (IC's), large-scale integrated circuits (LSI's), or the like, mounted on printed circuit boards for computers.

2. Description of the Related Art

Electronic components, such as IC's, LSI's, or the like, are now very highly sophisticated, and thus the density of such electronic components that can be mounted on a printed circuit board has increased. Accordingly, it has become very important to effectively cool these electronic components, since the amount of heat generated therefrom has correspondingly increased, and thus various compulsory cooling systems using a cooling media having a strong cooling capacity have been proposed.

U.S. Pat. No. 3,481,393 discloses a modular cooling system in which a plurality of modular cooling chambers are connected in series, each having a flat heat conductive side which can be attached to a flat backplate of an electronic module, to provide a good heat conduction to a cooling fluid circulating in the cooling chambers. Flexible conduits are connected between the outlet and inlet of the successive series-connected cooling chambers, so that the chambers can be attached to electronic modules of different heights and can be easily detached from the backplate without interrupting the coolant fluid flow therethrough, to enable the underlying electronic module to be tested, repaired or replaced without affecting the cooling of other modules in the series.

In this prior art, however, only a single supply system including a pump and a heat exchanger is provided for the plurality of modular cooling chambers, and therefore, such a coolant supplying system must be provided with a pressure or flow capacity sufficient to cover all of the modular chambers, even if the number of such chambers is increased. Also, it is impossible to adjust the pressure and temperature of the coolant to suit individual modular chambers.

U.S. Pat. No. 3,512,582 discloses an immersion cooling system for modularly packaged components, wherein a plurality of modular units are connected to a vessel containing a low-boiling-point liquid, so that an auxiliary cooling chamber of each modular unit is filled with the low-boiling point liquid. Each auxiliary chamber contains heat generating components which are cooled by the low-boiling-point liquid in which a nucleate boiling takes place, and a separate heat exchanger located in each auxiliary chamber removes the heat from the low-boiling-point liquid. The vessel provides a common venting and degassing of, and a pressure for, the individual cooling chambers.

U.S. Pat. No. 3,774,677 discloses a cooling system in which a spare condensing and cooling arrangement is provided in a liquid cooling system to condense vapors generated by nucleate boiling at a heat source. A two-phase flow is caused between the heat source, in the form of liquid and boiling vapors, and the spray condensing and cooling means, where the vapors are condensed by a cooler spray contained therein. The amount of spray, and accordingly the amount of vapor condensation, is controlled by a servo arrangement which regulates the pressure within the system.

SUMMARY OF THE INVENTION

An object of this invention is to provide an apparatus for circulating a coolant through a plurality of cooling modules for cooling electronic components, wherein the pipe construction is easily arranged in accordance with the cooling capabilities of the respective cooling modules.

Another object of this invention is to provide an apparatus for circulating the coolant, and obtaining an effective operation of the heat exchangers an an easy observation and maintenance of the temperature, flow, nature, or the like of the coolant.

According to this invention, there is provided an apparatus for supplying cooling fluid for circulation through a plurality of cooling modules for cooling electronic components, comprising a single tank for containing a cooling fluid; a plurality of cooling fluid supply systems independently connected to the respective cooling modules, each of the supply systems including a fluid line connected to the tank and provided with at least one pump and a heat exchanger, so that the cooling fluid in the tank is circulated through the respective cooling modules and returned to the tank, in which the cooling fluid is then mixed.

The tank may be provided with a cooling fluid cleaning means and/or a mixing promoting means.

In the coolant supply apparatus of this invention, the cooling fluid is supplied independently to the respective cooling systems, in such a manner that the pressure and flow of the cooling fluid in each cooling system are not affected by the other cooling systems, but is in accordance with the needs of the cooling module in question in the system. After flowing through the cooling module and carrying out the desired cooling, the cooling fluid in the respective cooling systems is collected in the tank and mixed therein. Therefore, the pressures and temperatures of the cooling fluid after carrying out the desired cooling in the respective cooling systems is made uniform, and the cooling fluid is then redistributed to the respective cooling systems. The removal of foreign substances, cleaning of the cooling fluid, monitoring the temperature thereof, and the like can be concentratedly carried out in the tank.

Accordingly, the heat exchangers in the respective cooling systems can be effectively operated, since the cooling fluids are independently supplied to the respective cooling systems in accordance with the needs of the individual cooling modules, and further the observation or maintenance of the temperature, flow, nature, or the like of the cooling fluid can be easily carried out.

DESCRIPTION OF THE PREFERRED EMBODIMENTS

Figure 1:
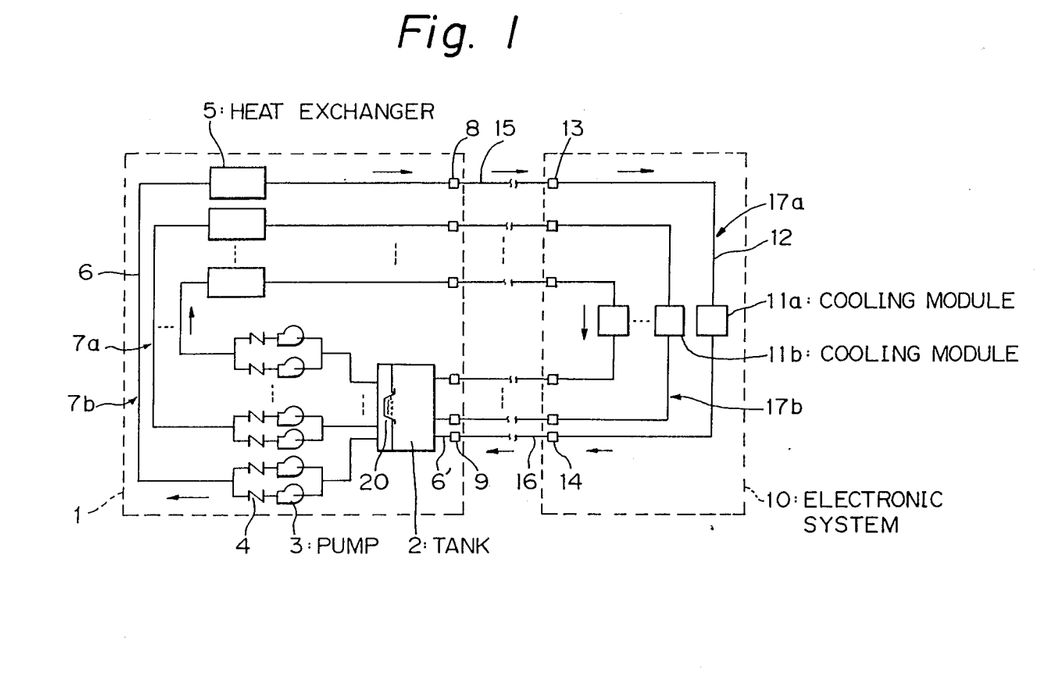
FIG. 1 is a block diagram illustrating a pipe arrangement of the cooling fluid supply apparatus according to this invention.

Referring now to the drawings, a cooling fluid supply system, generally indicated by a reference numeral 1 in FIG. 1, includes a common mixing tank 2 having a relatively large volume. The mixing tank 2 is a closed reservoir tank providing with a pressure release means (not shown), a strainer 20 comprising a metal sieve having a predetermined mesh, a mixing promoting means, and a liquid cleaning means, as described later. The tank 2 contains a coolant or cooling fluid, such as pure water including fluorocarbon or the like.

The liquid supply system 1 comprises a plurality of supply lines or systems 7a, 7b, ... arranged independently and in parallel to each other. Each of the fluid supply lines 7a, 7b, ... comprises, at the downstream side of the strainer 20 of the mixing tank 2, a liquid pipe 6 on which a pair of pumps 3 and check valves 4, a heat exchanger 5, and a coupling 8 are arranged in series, and at the upstream side of the strainer 20, each of the fluid lines 7a, 7b, ... comprises a return pipe 6' providing with a coupling 9.

Further, an electronic system, generally indicated by a reference numeral 10 in FIG. 1, comprises a plurality of supply lines 17a, 17b, ... arranged independently and in parallel to each other and connected to the supply lines 7a, 7b, ... respectively, via external liquid pipes 15 and 16. Each of the supply lines 17a, 17b, ... includes a pipe 12 provided with a single cooling module 11a, 11b, ... and coupling 13 and 14, which are connected to the couplings 8 and 9 via the external pipes 15 and 16, respectively, to constitute a plurality of cooling fluid circulation lines or systems.

In each of the circulation lines, the pump 3 and the heat exchanger 5 are selected in such a manner that the capacities, flows, or pressures thereof are sufficient to cover the amount of heat, number of elements in the cooling module 11, and the like.

Figure 2:
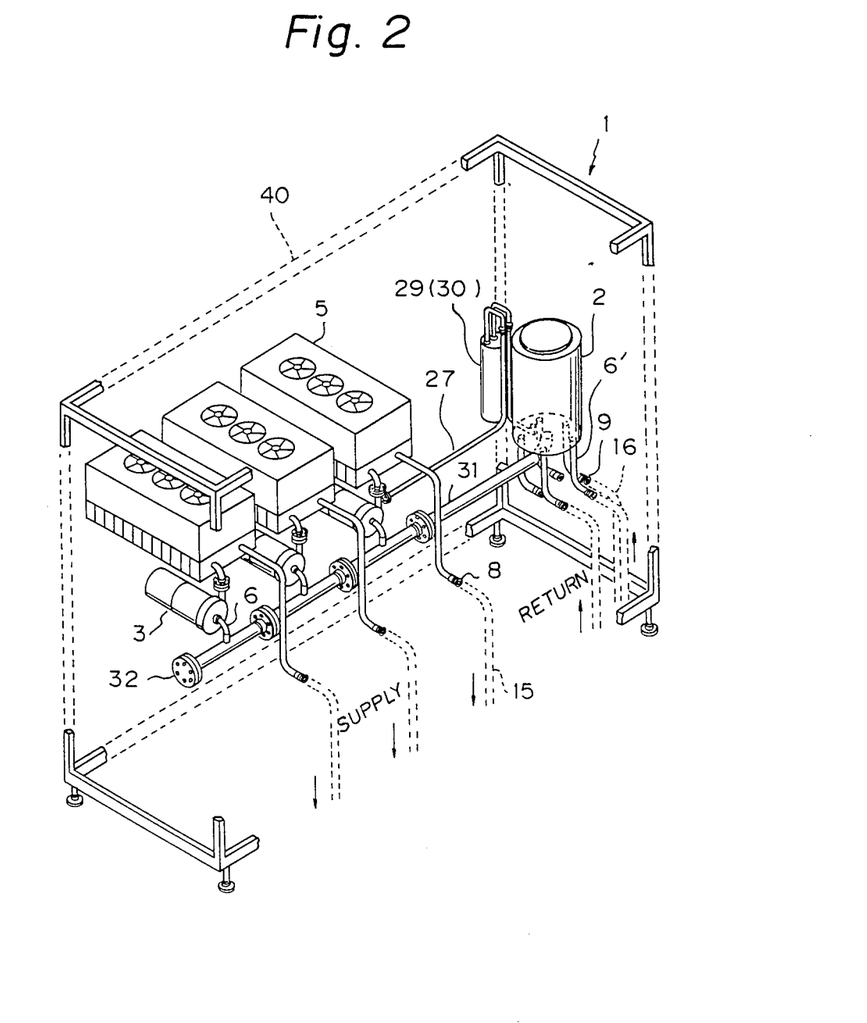
FIG. 2 is a perspective view of a cooling fluid supply system.

In FIG. 2, one of the embodiments of the cooling fluid supply system 1 is illustrated in a perspective view, in which the above-mentioned single mixing tank 2, respective pairs of pumps 3, and respective heat exchangers 5 are accommodated in a locker case 40. A main supply pipe 31 is constituted by a plurality of pipe sections which are connected to each other in series by flanges 32. One end of the main supply pipe 31 is connected to the mixing tank 2. Thus, the main pipe 31 may have a desired length in accordance with the number of the cooling fluid supply lines 6, i.e., the number of cooling modules 11. In FIG. 2, reference numerals 8 and 9 indicate couplings; 15, the external supply pipes; 16, the external return pipes; and 29(30), a liquid cleaning means as will be described later.

The main supply pipe 31 is connected to and opened at the center of the bottom wall of the mixing tank 2. On the other hand, the plurality of return pipes 6' are connected to the bottom wall of the mixing tank 2 and arranged to open therearound. Such an arrangement of the main supply pipe 31 and the plurality of return pipes 6' is effective to promote the mixing of the cooling water in the mixing tank 2.

Figure 3:
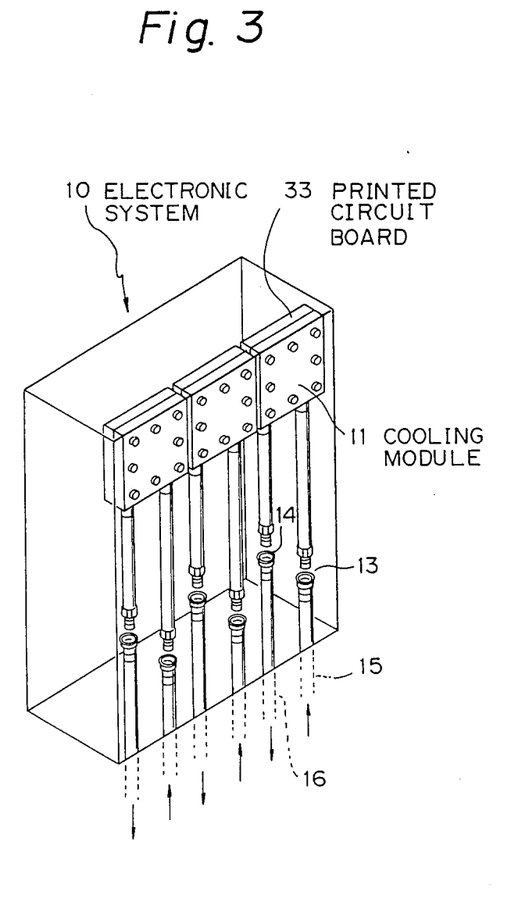
FIG. 3 is a perspective view of an electronic system.

FIG. 3 is a perspective view illustrating one of the embodiments of the electronic system 10, in which a desired number of cooling modules 11 are provided in accordance with the number of the printed circuit boards 33 on which various heat generating electronic elements, such as, IC's or LSI's, are mounted. Each cooling module 11 comprises a cooling plate which is known in the prior art and is connected to the external supply and return pipes 15 and 16 via the couplings 13 and 14, respectively.

Figure 4A:
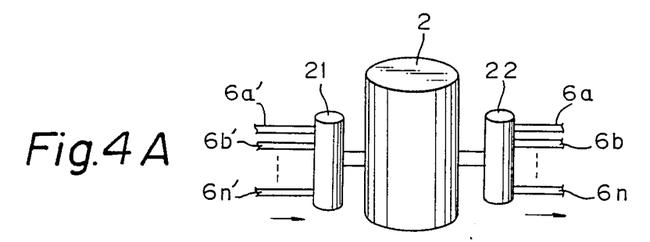
FIGS. 4A, 4B, and 4C illustrate embodiments of the mixing promoting means used in the apparatus of this invention; and, FIGS. 5A and 5B illustrate embodiments, of the cooling fluid cleaning means used in the apparatus of this invention.
Figure 4B:
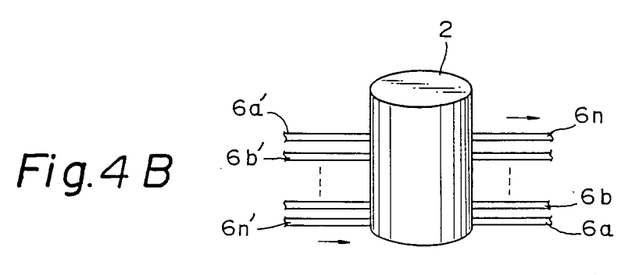
Figure 4C:
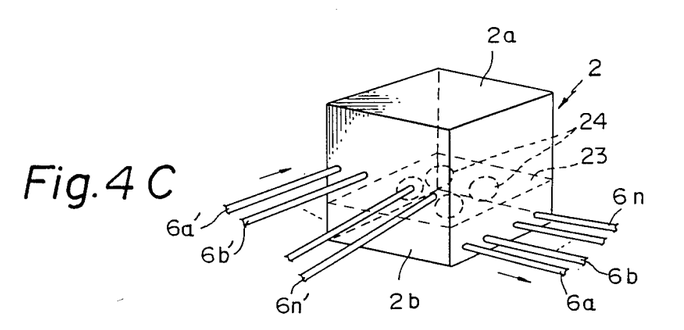

FIGS. 4A to 4C illustrate other embodiments of the cooling water mixing promoting means provided in the mixing tank 2.

In the embodiment shown in FIG. 4A, provided at the inlet side of the mixing tank 2 is a cylindrical header 21 to which the return pipes 6a', 6b', ... of the respective supply lines 7a, 7b, ... are connected. Similarly, provided at the outlet side of the mixing tank 2 is a cylindrical header 22 to which the liquid pipes 6a, 6b, ... are connected. Each of the cylindrical headers 21 and 22 has a volume smaller than that of the mixing tank 2, and accordingly, in this embodiment, the mixing of the cooling fluid is promoted by the differences in volume of the mixing tank 2 and the cylindrical headers 21 and 22.

In the embodiment shown in FIG. 4B, the return pipes 6a', 6b', ... of the respective supply lines 7a', 7b', ... (not shown) are connected in, alphabetical order, from the top to the bottom of the mixing chamber 2. Conversely, the respective distributing pipes 6a, 6b, ... are connected, in alphabetical order, from the bottom to the top of the mixing tank 2. Therefore, in this embodiment, the streams of cooling fluid flowing into and out of the tank 2 cross and impinge on each other, whereby the mixing of the cooling water is promoted.

In the embodiment of FIG. 4C, the mixing tank 2 is partitioned into upper and lower chambers 2a and 2b by a control plate 23 having holes or openings 24 of predetermined sizes for promoting the mixing of the cooling water. The return pipes 6a', 6b', ... are connected to the upper chamber 2a and the distributing pipes 6a, 6b, ... are connected to the lower chamber 2b, whereby the streams of cooling fluid flowing into and out of the tank 2 cross and impinge on each other when passing through the openings 24, and thus the mixing of the cooling water is promoted by the control plate 23.

Embodiments of the fluid or liquid cleaning means will now be described with reference to FIGS. 5A and 5B.

Figure 5A:
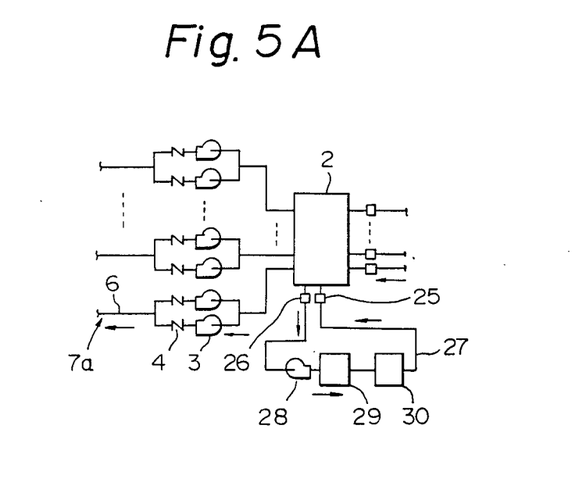

In the embodiment of FIG. 5A, a pipe 27 is connected at both ends to the mixing tank 2 via couplings 25 and 26, respectively, and is provided with a exclusive-use pump 28, a micro-filter 29 having a predetermined mesh such as 10.45 $\mu$s for removing foreign substances from the cooling fluid, and an ion exchanger 30 for neutralizing metal ions contained in the cooling fluid. This pipe 27 may be connected to the mixing tank 2 permanently or occasionally, for example, during maintenance or the like. When the pump 28 is operated, the cooling fluid within the mixing tank 2 is circulated through the micro-filter 29 and the ionic exchanger 30, whereby the cooling fluid for all of the cooling fluid supply systems is throughly cleaned.

Figure 5B:
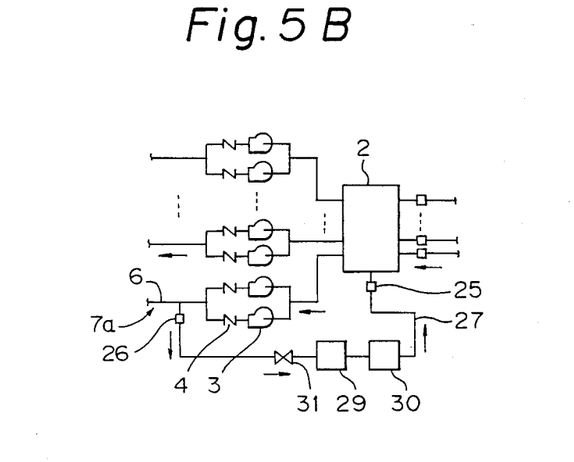

In the embodiment of FIG. 5B (also shown in FIG. 2), a pipe 27 provided with a micro-filter 29, an ion exchanger 30, and a flow control valve 31 is connected at one end to the mixing tank 2 via a coupling 25 and connected at the other end to the downstream side of the pumps 3 in the pipe 6 of one of the cooling fluid supply systems (e.g., 7a) via a coupling 26. In this embodiment, a part of the cooling fluid flows from the cooling fluid supply system 7a to the ion exchanger 30 and the micro-filter 29 via the control valve 31, so that the cooling fluid is cleaned without the need for an exclusive-use pump.

In the fluid or liquid cleaning means as shown in FIGS. 5A and 5B, either just the micro-filter 29 or the ion exchanger 30 may be provided instead of both devices.

What is claimed is:

1. An apparatus for supplying cooling fluid for circulation through a plurality of cooling modules for cooling electronic components, comprising:
   a single tank for containing cooling fluid;
   a plurality of cooling fluid supply systems independently connected to said plurality of cooling modules;
   each of said cooling fluid supply systems including a fluid line connected to said tank and provided with at least one pump and a heat exchanger, to circulate the cooling fluid from said tank through said respective cooling modules and back to said tank, in which the cooling fluid is then mixed.

2. An apparatus according to claim 1, which includes a cooling fluid cleaning means.

3. An apparatus according to claim 2, wherein said cooling fluid cleaning means comprises a further fluid line connected to said tank and provided with a pump and a cooling fluid cleaning element, so that said cooling fluid from said tank is circulated through said cooling fluid cleaning element when returned to said tank.

4. An apparatus according to claim 3, wherein said cooling fluid cleaning element comprises at least one of a filter for removing foreign substances from the cooling fluid and an ion exchanger for neutralizing metal ions contained in the cooling fluid.

5. An apparatus according to claim 3, wherein both ends of said further fluid line are connected to said tank and said pump of said cooling fluid cleaning means is an exclusive-use pump.

6. An apparatus according to claim 3, wherein said further fluid line comprises a pipe provided with said cooling fluid cleaning element and having one end connected to said tank and the other end connected to the fluid line of one of said cooling fluid supply systems, at a point downstream of the pump of said one cooling fluid supply system, so that said pump not only circulates the cooling fluid through said one cooling fluid supply system, but also circulates a part of the cooling fluid through said pipe of said further fluid line.

7. An apparatus according to claim 3, wherein said tank is provided with mixing promoting means.

8. An apparatus according to claim 7, wherein said mixing promoting means comprises:
   a control plate partitioning said tank into first and second chambers which are communicated with each other via a plurality of openings provided in said control plate; and,
   wherein each of said cooling fluid supply systems includes a supply and a return pipe which are connected to said first and second chambers, respectively.

9. An apparatus according to claim 7, wherein said mixing promoting means comprises supply and return pipes of said fluid supply systems connected to said tank at different positions.

10. An apparatus according to claim 7, wherein each of said cooling fluid supply systems includes a supply pipe and said mixing promoting means comprises a header having one side connected to said tank and the other side connected to a plurality of said supply pipes.

11. An apparatus according to claim 7, wherein each of said fluid supply systems includes a return pipe and said mixing promoting means comprises a header having one side connected to said tank and the other side connected to a plurality of said return pipes.

12. An apparatus according to claim 7, wherein each of said cooling fluid systems includes a supply pipe and a return pipe and said mixing promoting means comprises:
   a first header having one side connected to said tank and the other side connected to a plurality of said supply pipes; and
   a second header having one side connected to said tank and the other side connected to a plurality of said return pipes.

13. An apparatus according to claim 7, wherein said mixing tank has a cylindrical chamber and a bottom wall and said mixing promoting means comprises:
   a main supply pipe connected to and opened at the center of said bottom wall of the mixing tank;
   a plurality of supply pipes of said fluid supply systems connected to said main supply pipe; and
   a plurality of return pipes of said fluid supply systems connected to said bottom wall of the mixing tank and opened therearound.

14. An apparatus according to claim 1, wherein said tank is provided with mixing promoting means.

15. An apparatus according to claim 14, wherein said mixing promoting means comprises:
   a control plate partitioning said tank into first and second chambers which are communicated with each other via a plurality of openings provided in said control plate; and,
   wherein each of said cooling fluid supply systems includes a supply and return pipe which are connected to said first and second chambers, respectively.

16. An apparatus according to claim 14, wherein said mixing promoting means comprises supply and return pipes of said fluid supply systems connected to said tank at different positions.

17. An apparatus according to claim 14, wherein each of said cooling fluid supply systems includes a supply pipe and said mixing promoting means comprises a header having one side connected to said tank and the other side connected to a plurality of said supply pipes.

18. An apparatus according to claim 14, wherein each of said cooling fluid supply pipes includes a return pipe and said mixing promoting means comprises a header having one side connected to said tank and the other side connected to a plurality of said return pipes.

19. An apparatus according to claim 14, wherein each of said cooling fluid systems includes a supply pipe and a return pipe and said mixing promoting means comprises:
   a first header having one side connected to said tank and the other side connected to a plurality of said supply pipes; and
   a second header having one side connected to said tank and the other side connected to a plurality of said return pipes.

20. An apparatus according to claim 14, wherein
   said mixing tank has a cylindrical chamber and a bottom wall; and said mixing promoting means comprises:
   a main supply pipe connected to and opened at the center of said bottom wall of the mixing tank;
   a plurality of supply pipes of said fluid supply systems connected to said main supply pipe; and,
   a plurality of return pipes of said fluid supply systems connected to said bottom wall of the mixing tank and opened therearound.

* * * * *

UNITED STATES PATENT AND TRADEMARK OFFICE
CERTIFICATE OF CORRECTION

PATENT NO. : 4,865,123
DATED : September 12, 1989
INVENTOR(S) : HISASHI KAWASHIMA et al.

It is certified that error appears in the above-identified patent and that said Letters Patent is hereby corrected as shown below:

Title page:

[30] Foreign Application Priority Data, "62-26124"

should be --62-267124--.

Column 4, line 24, "7a'" should be --7a--;

line 25, "connected in," should be --connected,       in--;

Column 5, line 47, "3" should be --1--;

line 68, after "said" insert --cooling--, delete       "systems", after "supply" insert --pipes--.

Column 6, line 32, after "and" insert --a--;

line 47, delete "pipes" and insert --systems--;

line 60, delete ";";

UNITED STATES PATENT AND TRADEMARK OFFICE
CERTIFICATE OF CORRECTION

PATENT NO. : 4,865,123

DATED : September 12, 1989

INVENTOR(S) : HISASHI KAWASHIMA et al.

It is certified that error appears in the above-identified patent and that said Letters Patent is hereby corrected as shown below:

Column 6, line 65, delete ",".

Signed and Sealed this

Thirteenth Day of November, 1990

*Attest:*

HARRY F. MANBECK, JR.

*Attesting Officer*     *Commissioner of Patents and Trademarks*